US011001496B2

(12) United States Patent
Iaccarino et al.

(10) Patent No.: US 11,001,496 B2
(45) Date of Patent: May 11, 2021

(54) MICROELECTROMECHANICAL SYSTEMS SENSOR TESTING DEVICE, SYSTEM AND METHOD

(71) Applicant: STMICROELECTRONICS S.R.L., Agrate Brianza (IT)

(72) Inventors: Federico Iaccarino, Milan (IT); Andrea Labombarda, Milan (IT); Fabio Tota, Pavia (IT); Stefano Bosco, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 299 days.

(21) Appl. No.: 16/100,767

(22) Filed: Aug. 10, 2018

(65) Prior Publication Data

US 2020/0048083 A1 Feb. 13, 2020

(51) Int. Cl.
*B81C 99/00* (2010.01)
*B81B 7/00* (2006.01)
*G01R 31/317* (2006.01)
*G01R 31/28* (2006.01)
*G01R 31/30* (2006.01)

(52) U.S. Cl.
CPC ........ *B81C 99/0035* (2013.01); *B81B 7/0006* (2013.01); *B81B 7/007* (2013.01); *G01R 31/2884* (2013.01); *G01R 31/3004* (2013.01); *G01R 31/31702* (2013.01); *B81B 2201/02* (2013.01); *B81B 2207/03* (2013.01)

(58) Field of Classification Search
CPC ........................... B81C 99/0035; B81B 7/0006
USPC ........................................................ 702/117
See application file for complete search history.

(56) References Cited

U.S. PATENT DOCUMENTS

| 2011/0149266 | A1* | 6/2011 | Motzer | G01S 5/16 356/4.01 |
| 2011/0301901 | A1* | 12/2011 | Panagas | G01C 25/005 702/104 |
| 2014/0260508 | A1* | 9/2014 | Dar | B81C 99/003 73/1.01 |
| 2014/0303926 | A1* | 10/2014 | Sessego | G01C 25/005 702/104 |
| 2015/0204904 | A1* | 7/2015 | Beyeler | G01R 1/0408 324/750.25 |
| 2018/0170749 | A1* | 6/2018 | Boyd | G01R 31/2884 |
| 2019/0062147 | A1* | 2/2019 | Castro | B81B 7/0045 |

* cited by examiner

*Primary Examiner* — Ricky Ngon
(74) *Attorney, Agent, or Firm* — Seed IP Law Group LLP

(57) ABSTRACT

A microelectromechanical system (MEMS) sensor testing device, system and method are provided. The testing device includes a socket having a plurality of pads configured to receive a respective plurality of pins of the MEMS sensor, a body having a plurality of operable positions associated with a respective plurality of orientations of the MEMS sensor and circuitry which performs a method for testing the MEMS sensor in the plurality of operable positions. The method includes, for each position of the plurality of operable positions, outputting an indication of the position to the plurality of operable positions, receiving one or more measurements made by the MEMS sensor at the respective position and determining whether the one or more measurements satisfy a reliability criterion. The method includes generating a report based on the plurality of measurements and indicating whether the plurality of measurements satisfy a plurality of reliability criteria, respectively.

23 Claims, 5 Drawing Sheets

FIG. 5

| | | | | | | | | | | | | | | |
|---|---|---|---|---|---|---|---|---|---|---|---|---|---|---|
| DUT ID | Test | | | | | | | | | | | | | |
| TEST DATE | 7/15/2018 3:57:12 PM | | | | | | | | | | | | | |
| VDD-VDDIO | 1.80,1.80 | | | | | | | | | | | | | |
| COMM. PROT. | SP14,2.62MHz | | | | | | | | | | | | | |
| DUT SN | 64\83\20\9A\0E\87.... | | | | | | | | | | | | | |
| CONTINUITY | PASS | | | | | | | | | | | | | |
| CURR CONS | IddIO [uA] | PD [uA] | Combo [uA] | XL only [uA] | Gyro only [uA] | | | | | | | | | |
| | 0.2883 | 2.5945 | 631.41 | 150.64 | 536.48 | | | | | | | | | |
| Test 4P | X [mg] | | Y [mg] | | Z [mg] | | Pitch [dps] | | Roll [dps] | | Yaw [dps] | | | |
| | μ | σ | μ | σ | μ | σ | μ | σ | μ | σ | μ | σ | | |
| | High Performance Mode | | | | | | | | | | | | | |
| Pos 1 | -0.64 | 0.65 | -43.27 | 0.61 | 1003.15 | 1.20 | 0.48 | 0.04 | -0.12 | 0.04 | 0.06 | 0.02 | | |
| Pos 2 | -0.56 | 1.06 | -43.12 | 0.67 | 1003.21 | 3.21 | 0.47 | 0.04 | -0.12 | 0.06 | 0.06 | 0.02 | | |
| Pos 3 | -0.54 | 0.60 | -43.09 | 0.58 | 1003.07 | 0.76 | 0.46 | 0.04 | -0.11 | 0.02 | 0.06 | 0.03 | | |
| Pos 4 | -0.60 | 0.67 | -43.10 | 0.61 | 1003.11 | 1.16 | 0.44 | 0.04 | -0.11 | 0.04 | 0.06 | 0.02 | | |
| | Self Test Mode | | | | | | | | | | | | | |
| Pos 1 | 502.33 | 1.20 | 468.10 | 1.10 | 1368.61 | 1.34 | 352.79 | 0.28 | 370.82 | 0.30 | 373.44 | 0.30 | | |
| Pos 2 | 502.41 | 1.07 | 468.31 | 1.13 | 1368.53 | 1.46 | 353.10 | 0.26 | 371.14 | 0.27 | 373.77 | 0.27 | | |
| Pos 3 | 502.16 | 1.12 | 468.18 | 1.14 | 1368.62 | 1.23 | 352.95 | 0.23 | 371.00 | 0.25 | 373.62 | 0.25 | | |
| Pos 4 | 502.23 | 1.23 | 468.31 | 1.01 | 1368.42 | 2.11 | 352.83 | 0.25 | 370.89 | 0.27 | 373.51 | 0.27 | | |
| ST CHECK | 502.97 | | 511.27 | | 365.39 | | 352.45 | | 371.08 | | 373.53 | | | |
| FIFO TEST | PASS | | | | | | | | | | | | | |

MICROELECTROMECHANICAL SYSTEMS SENSOR TESTING DEVICE, SYSTEM AND METHOD

BACKGROUND

Technical Field

This disclosure relates to testing devices for microelectromechanical system (MEMS) sensors.

Description of the Related Art

MEMS sensors are typically manufactured, by original equipment manufacturers (OEMs), among others, and supplied to system integrators (or assemblers) for use in their products. Some MEMS sensors may malfunction or operate in an abnormal manner (for example, outside of the operating range specified in their specification sheets). It is challenging to evaluate and diagnose MEMS sensor malfunction on-site and at system integrator (or product assembler) facilities.

BRIEF SUMMARY

In an embodiment, a device, comprises: a socket configured to be coupled to a microelectromechanical system (MEMS) sensor; a body having a plurality of operable positions associated with a respective plurality of orientations of the MEMS sensor; and circuitry which, in operation, performs a method for testing the MEMS sensor in the plurality of operable positions, the method including: for each position of the plurality of operable positions: outputting an indication of the position to the plurality of operable positions; receiving one or more measurements made by the MEMS sensor at the respective position of the plurality of operable positions; and determining whether the one or more measurements satisfy a reliability criterion of a plurality of reliability criteria; generating a report based on the plurality of measurements and indicating whether the plurality of measurements satisfy the plurality of reliability criteria, respectively; and outputting the report. In an embodiment, the circuitry comprises: a current sensing circuit coupled to the socket and configured to measure current consumption of one or more power domains of the MEMS sensor and output the measured current consumption of one or more power domains. In an embodiment, the circuitry in operation: receives the measured current consumption of one or more power domains; determines whether the measured current consumption falls within a range of current consumption values; and generates the report indicating the measured current consumption and whether the measured current consumption falls within the range of current consumption values. In an embodiment, the MEMS sensor includes a plurality of pins and the socket includes a plurality of pads, and the circuitry, in operation, performs continuity testing on the plurality of pins. In an embodiment, the plurality of pins are configured to be coupled to plurality of pads, respectively, and each pin of the plurality of pins is coupled to an anode of a supply voltage clamping diode and a cathode of a reference voltage clamping diode. In an embodiment, the circuitry includes a continuity detection circuit which in operation: couples a cathode of the supply voltage clamping diode to a reference supply voltage node that supplies a reference voltage; detects a voltage drop across the supply voltage clamping diode; couples an anode of the reference voltage clamping diode to a supply voltage node that supplies a supply voltage; and detects a voltage drop across the reference clamping diode; and outputs an indication of the voltage drop across the supply voltage clamping diode and the voltage drop across the reference voltage clamping diode to the circuitry. In an embodiment, the circuitry in operation: receives the indication of the voltage drop across the supply voltage clamping diode and the voltage drop across the reference voltage clamping diode; determines whether the voltage drop across the supply voltage clamping diode is within a range of voltages; determines whether the voltage drop across the reference voltage clamping diode is within the range of voltages; determines that the supply voltage clamping diode is malfunctioning if the voltage drop across the supply voltage clamping diode is outside the range of voltages; determines that the reference voltage clamping diode is malfunctioning if the voltage drop across the reference voltage clamping diode is outside the range of voltages; and generates the report indicating whether the supply voltage clamping diode is malfunctioning and whether the reference voltage clamping diode is malfunctioning. In an embodiment, the circuitry in operation: generates the report indicating whether the supply voltage clamping diode is malfunctioning and whether the reference voltage clamping diode is malfunctioning. In an embodiment, the circuitry in operation: generates the report including an identity of the MEMS sensor, a test date, a voltage of the one or more power domains of the MEMS sensor and an identity of a communication protocol used to communicate with the MEMS sensor. In an embodiment, the circuitry in operation: retrieves data stored in a first input first output (FIFO) memory of the MEMS sensor; determines whether the data retrieved from the FIFO memory and data retrieved from the MEMS sensor correspond to each other; and in response to determining that the data retrieved from the FIFO memory and corresponds to the data retrieved from the MEMS sensor, generates the report indicating that the FIFO memory is operating properly. In an embodiment, the body is a cube and the plurality of operable positions are associated with a plurality of sides of the cube. In an embodiment, determining whether the one or more measurements satisfy the reliability criterion includes determining whether the one or more measurements are within a respective range of values associated with the position of a plurality of ranges of values.

In an embodiment, a method comprises: outputting, by a processor of a portable hand-held testing device, an indication of a position of a plurality of operable positions of the portable hand-held testing device, the position of the plurality of operable positions being associated with a respective orientation of a plurality of orientations of a MEMS sensor; receiving, by the processor, one or more measurements made by the MEMS sensor at the position; determining, by the processor, whether the one or more measurements are within a range of values associated with the position; generating a report indicating the one or more measurements and whether the one or more measurements are within the range of values; and outputting the report. In an embodiment, the method comprises: measuring, by a current sensing circuit of the portable hand-held testing device, current consumption of one or more power domains of the MEMS sensor; determining, by the processor, whether the measured current consumption falls within a range of current consumption values; and generating the report indicating the measured current consumption and whether the measured current consumption falls within the range of current consumption values. In an embodiment, the MEMS sensor includes a plurality of pins and wherein each pin of the plurality of pins is coupled to an anode of a supply voltage clamping diode and a cathode of a reference voltage clamping diode. In an embodiment, the method comprises: coupling, by a continuity detection circuit of the portable hand-held testing device, a cathode of the supply voltage clamping diode to a reference supply voltage node that supplies a reference voltage; detecting a voltage drop across the supply voltage clamping diode; coupling an anode of the reference voltage clamping diode to a supply voltage node that supplies a supply voltage; and detecting a voltage drop across the reference clamping diode. In an embodiment, the method comprises: determining, by the processor, whether the voltage drop across the supply voltage clamping diode is within a range of voltages; determining, by the processor, whether the voltage drop across the reference voltage clamping diode is within the range of voltages; determining, by the processor, that the supply voltage clamping diode is malfunctioning if the voltage drop across the supply voltage clamping diode is outside the range of voltages; determining, by the processor, that the reference voltage clamping diode is malfunctioning if the voltage drop across the reference voltage clamping diode is outside the range of voltages; and generating, by the processor, the report indicating whether the supply voltage clamping diode is malfunctioning and whether the reference voltage clamping diode is malfunctioning. In an embodiment, the method comprises: generating the report including an identity of the MEMS sensor, a test date and an identity of a communication protocol used to communicate with the MEMS sensor. In an embodiment, the portable hand-held testing device has a cubic body and the plurality of operable positions are associated with a plurality of sides of the cubic body. In an embodiment, the method comprises: outputting, by the processor of the portable hand-held testing device, an indication of a second position of the plurality of operable positions of the portable hand-held testing device; receiving, by the processor, one or more second measurements made by the MEMS sensor at the second position; determining, by the processor, whether the second one or more measurements are within a second range of values associated with the second position; and generating the report indicating the one or more second measurements and whether the one or more second measurements are within the second range of values.

In an embodiment, a non-transitory computer readable medium, has stored thereon, instructions that when executed by a computing device, cause the computing device to perform operations comprising: outputting an indication of a position of a plurality of operable positions of a portable hand-held testing device, the position of the plurality of operable positions being associated with a respective orientation of a plurality of orientations of a MEMS sensor; receiving one or more measurements made by the MEMS sensor at the position; determining whether the one or more measurements are within a range of values associated with the position; generating a report indicating the one or more measurements and whether the one or more measurements are within the range of values; and outputting the report. In an embodiment, the instructions cause the computing device to perform operations comprising: measuring current consumption of one or more power domains of the MEMS sensor; determining whether the measured current consumption falls within a range of current consumption values; and generating the report indicating the measured current consumption and whether the measured current consumption falls within the range of current consumption values. In an embodiment, the instructions cause the computing device to perform operations comprising: generating the report including an identity of the MEMS sensor, a test date and an identity of a communication protocol used to communicate with the MEMS sensor. In an embodiment, wherein the instructions cause the computing device to perform operations comprising: outputting, by the processor of the portable hand-held testing device, an indication of a second position of the plurality of operable positions of the portable hand-held testing device; receiving, by the processor, one or more second measurements made by the MEMS sensor at the second position; determining, by the processor, whether the second one or more measurements are within a second range of values associated with the second position; and generating the report indicating the one or more second measurements and whether the one or more second measurements are within the second range of values.

BRIEF DESCRIPTION OF THE SEVERAL VIEWS OF THE DRAWINGS

FIG. 5 shows an example embodiment of a report generated by a testing device of an embodiment.

DETAILED DESCRIPTION

Figure 1:
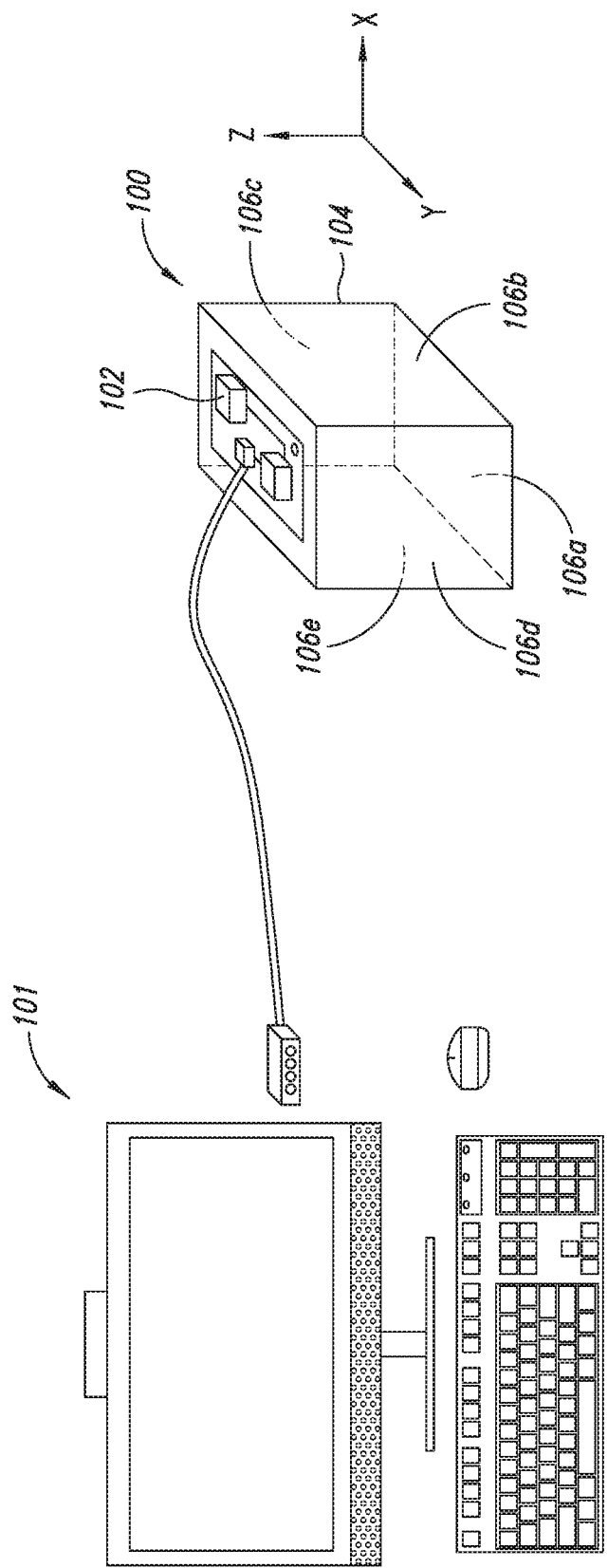
FIG. 1 shows an embodiment of a testing device for a microelectromechanical system (MEMS) sensor.

FIG. 1 shows an embodiment of a testing device 100 for a microelectromechanical system (MEMS) sensor 102. The testing device is configured to be coupled to a computer 101. The MEMS sensor 102 may be any type of sensor such as an accelerometer, gyroscope or pressure sensor, among others. The MEMS sensor 102 may have a mass (not shown) that is used to measure acceleration, orientation, rotation or pressure, among other types of measurements. The testing device 100 tests the MEMS sensor 102 and outputs a report indicative of results of the testing to the computer 101. The report may be used to diagnose a failure or malfunction of the MEMS sensor 102.

The testing device 100 may be a portable device (or a handheld device) that is made available by the MEMS sensor 102 manufacturer, such as an original equipment manufacturer (OEM). The testing device 100 may be made available to a system integrator (or assembler) that uses the MEMS sensor 102 in making a device or a product, such as a consumer electronics device. The testing device 100 may test the MEMS sensor 102 and output a report to the system integrator for evaluating the MEMS sensor 102. For example, the testing device 100 may output a report to the computer 101 for use by a system integrator. Further, the testing device 100 may output the report to the manufacturer for troubleshooting the MEMS sensor 102.

The testing device 100 includes a body 104 that facilitates changing the orientation of the MEMS sensor 102 under test. Some MEMS sensors, such as accelerometers and gyroscopes, are used to detect a position or an orientation of a device or body to which they are connected. The body 104 enables changing the orientation of the MEMS sensor 102 under test with ease (for example, by a technician) and testing the MEMS sensor 102 at various orientations. The body 104 is shown in FIG. 1 to be a cube having a plurality of sides 106a, 106b, 106c, 106d, 106e, 106f. Depending on the orientation of the cube 104, a different axis of a gyroscope is acted on by gravitational pull and is, accordingly, tested by the testing device 100. The cube 104 allows for changing the orientation of the MEMS sensor 102 such that the MEMS sensor 102 is tested across all axes. When the cube 104 rests on a first side 106a of the body 104, the positional information determined by the MEMS sensor 102 for the z-axis is tested. Similarly, resting the cube 104 on a second side 106b and a third side 106c allows for testing the positional detection of the MEMS sensor 102 for the x-axis and y-axis, respectively. In some embodiments, the assembly including the MEMS sensor 102 may be recessed to allow for resting the cube 104 on a sixth side 106f and testing the MEMS sensor 102.

Figure 2:
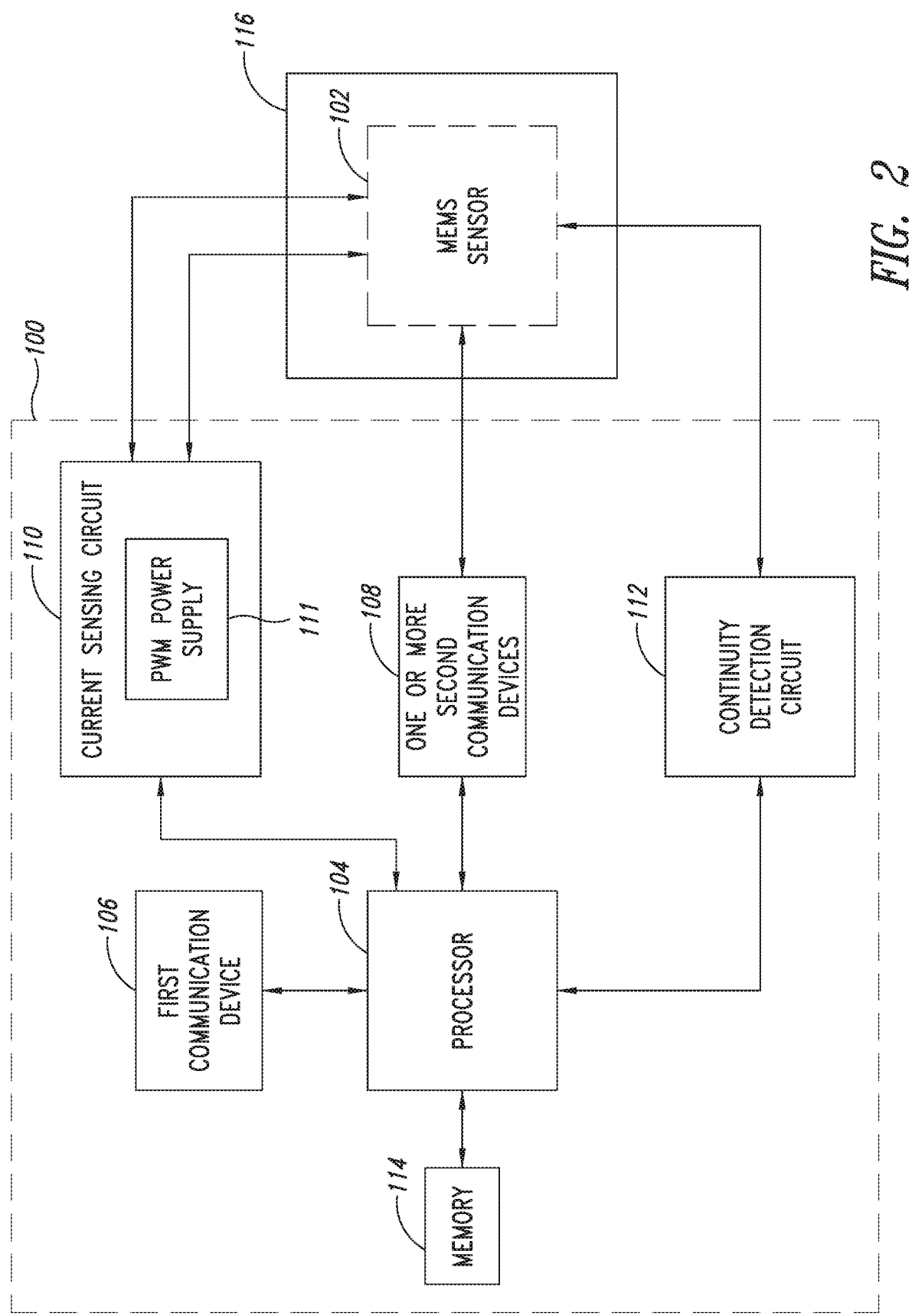
FIG. 2 shows a block diagram of a testing device in accordance with an embodiment.

FIG. 2 shows a functional block diagram of the testing device 100 in accordance with an embodiment. The testing device 100 is shown to be coupled to the MEMS sensor 102. The testing device 100 includes a processor or processing circuitry 104, a first communication device or interface 106, one or more second communication devices or interfaces 108, a current sensing circuit 110, a continuity detection circuit 112, memory 114 and a socket 116. The current sensing circuit 110 includes a pulse-width modulation (PWM) power supply 111. The PWM power supply 111 may be a dual-channel voltage regulator that provides power to the current sensing circuit 110. The first communication device 106, one or more second communication devices 108, current sensing circuit 110, continuity detection circuit 112 and memory 114 are communicatively coupled to the processor 104. The one or more second communication devices 108, current sensing circuit 110 and continuity detection circuit 112 are coupled to the socket 116.

The processor 104 may be any type of device configured to perform computing operations. The processor 104 performs the techniques and operations described herein. The processor 104 may be a controller, a microcontroller or a microprocessor among others. The processor 104 commands the current sensing circuit 110 and continuity detection circuit 112 to test the MEMS sensor 102. The processor 104 additionally communicates with the MEMS sensor 102 using the one or more second communication devices 108. The processor 104 performs tests on the MEMS sensor 102, generates a report of the tests and outputs the report to the computer 101 as described herein. The processor 104 may communicate over multiple communication protocols, such as an Inter-Integrated Circuit (I2C) protocol or a System Packet Interface (SPI) compliant protocol, among others.

The memory 114 may be any type of storage device configured to store data. The memory 114 may store executable instructions that, when executed by the processor 104, cause the processor to perform the operations described herein. The memory 114 may store executable instructions that, when executed by the processor 104, cause the processor to test the MEMS sensor 102. The memory 114 may, for example, be a random access memory (RAM) or a read-only memory (ROM), among others.

The socket 116 may be a printed circuit board or an integrated circuit. The socket 116 may have a plurality of pads. The MEMS sensor 102 may be soldered or wire-bonded to make contact with the pads. Further, the MEMS sensor 102 may be connected to the pad using probe needles. The one or more second communication devices 108 may communicate with the MEMS sensor 102 while the MEMS sensor 102 is coupled to the socket 116 and the current sensing circuit 110 tests the MEMS sensor 102 while the MEMS sensor 102 is coupled to the socket 116. The continuity detection circuit 112 may test the pins of the MEMS sensor 102 as described herein.

The first communication device 106 may be any type of device configured to traffic data between the processor 104 and another device, such as the computer 101 or a communication device thereof. The first communication device 106 may be a peripheral device, such as a port for wired communications or a modem for wireless communications. The first communication device 106 may be a connector or a cable compliant with the Universal Serial Bus (USB) standard.

The one or more second communication devices 108 may each be any type of device configured to traffic data between the processor 104 and another device, such as the MEMS sensor 102. Different types of MEMS sensors 102 may have different types of communications interfaces. To ensure compatibility with various types of MEMS sensors 102, the testing device 100 may include one or more second communication devices 108, whereby each second communication device 108 may be compliant with a communication interface. For example, one second communication device 108 may be an I2C protocol-compliant device and another second communication device 108 may be an SPI protocol-compliant device. In operation, the MEMS sensor 102 under test is coupled via the socket 116 to a second communication device 108 that is compatible with the communication capability of the MEMS sensor 102 under test.

The current sensing circuit 110 may be any type of device configured to detect a current consumption of the MEMS sensor 102. The current sensing circuit 110 may be coupled to the socket 116 to which the MEMS sensor 102 is coupled. The current sensing circuit 110 may include a sense resistance or any type of current sensing device. The current sensing circuit 110 detects the current consumption (or absorption) of the MEMS sensor 102 and outputs a signal representative of the current consumption to the processor 104. The current sensing circuit 110 may sense the current consumption of a plurality of power domains of the MEMS sensor 102 at the same time. The plurality of power domains may include an input/output (I/O) power domain and device power domain, whereby the input/output power domain may be used to communicate with other devices and the device power domain may be used to power the components of the MEMS sensor 102. Current consumption may be detected in various modes of the MEMS sensor 102, such as a power down mode in which the MEMS sensor 102 is powered down or an operational mode in which the MEMS sensor 102 is turned on and operating.

The continuity detection circuit 112 may be any type of device configured to test built-in protective diodes of the MEMS sensor 102. Each pin of the MEMS sensor 102 has a supply voltage clamping diode and a reference voltage clamping diode. The continuity detection circuit 112 tests the supply voltage clamping diode by applying a reference voltage to a cathode of the supply voltage clamping diode and measures the resulting voltage drop across the supply voltage clamping diode. The continuity detection circuit 112 tests the reference voltage clamping diode by applying a supply voltage to an anode of the reference voltage clamping diode and measures the resulting voltage drop across the reference voltage clamping diode. The continuity detection circuit 112 sends a signal to the processor 104 indicative of the measured voltage drop. A diode may be deemed to have passed the continuity test if the voltage drop is in a determined operational range, such as 0.3 Volts (V) to 0.9V. A diode is shorted if the voltage drop is less than 0.3V and is open if the voltage drop is greater than 0.9V.

Figure 3:
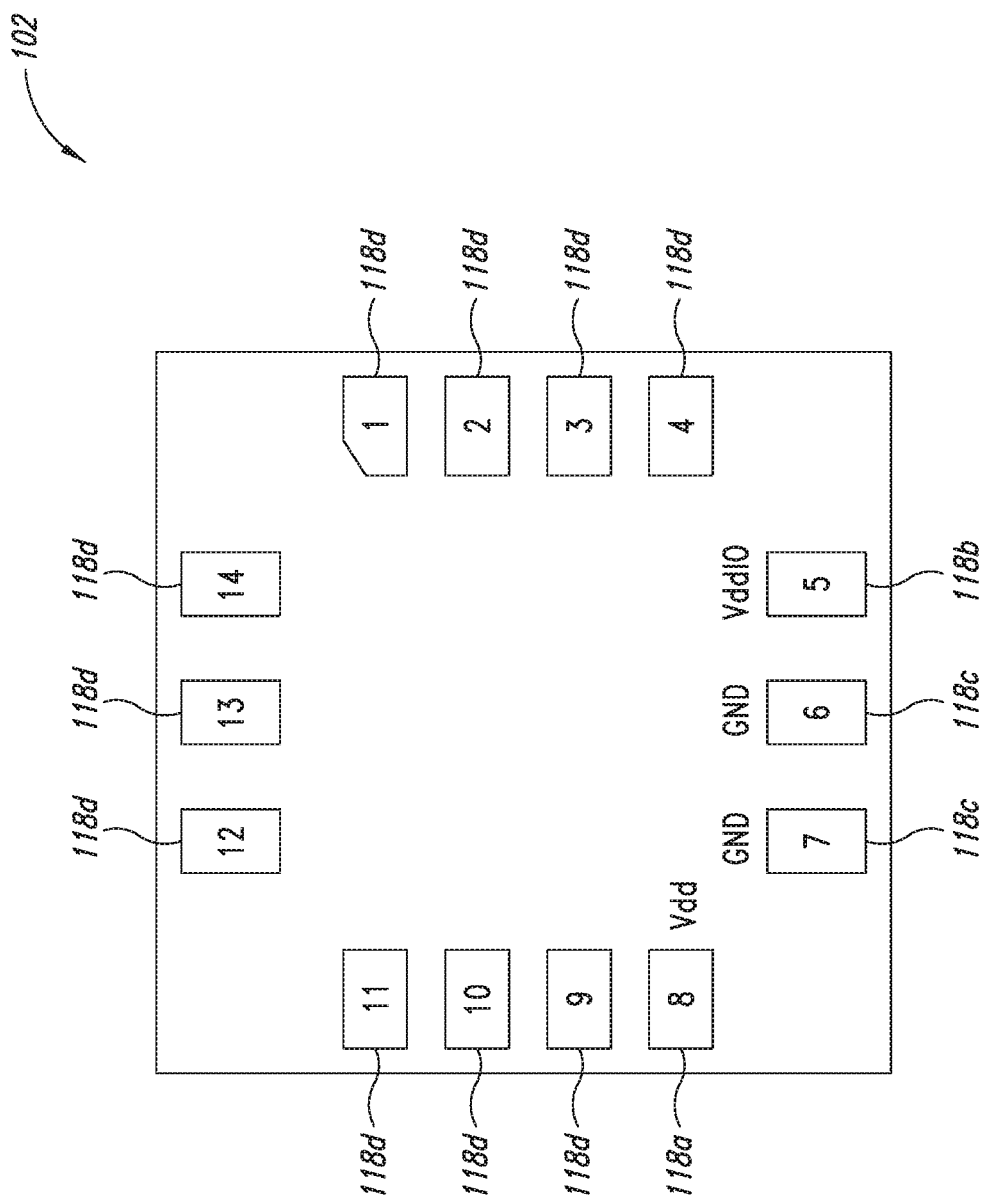
FIG. 3 shows a diagram of a socket of a testing device in accordance with an embodiment.

FIG. 3 shows a diagram of a plurality of pins 118a-118d of the MEMS sensor 102. The MEMS sensor 102 is received by a socket, whereby corresponding pins 118a-118d of the MEMS sensor 102 are coupled to a respective plurality of pads of the socket 116. When the testing device 100 is used to test the MEMS sensor 102, the pins of the MEMS sensor 102 may be soldered to their corresponding pads on the socket 116. The plurality of pins include a supply voltage pin 118a, an input/output (I/O) supply voltage pin 118b, two ground voltage pins 118c and a plurality of other pins 118d.

Figure 4:
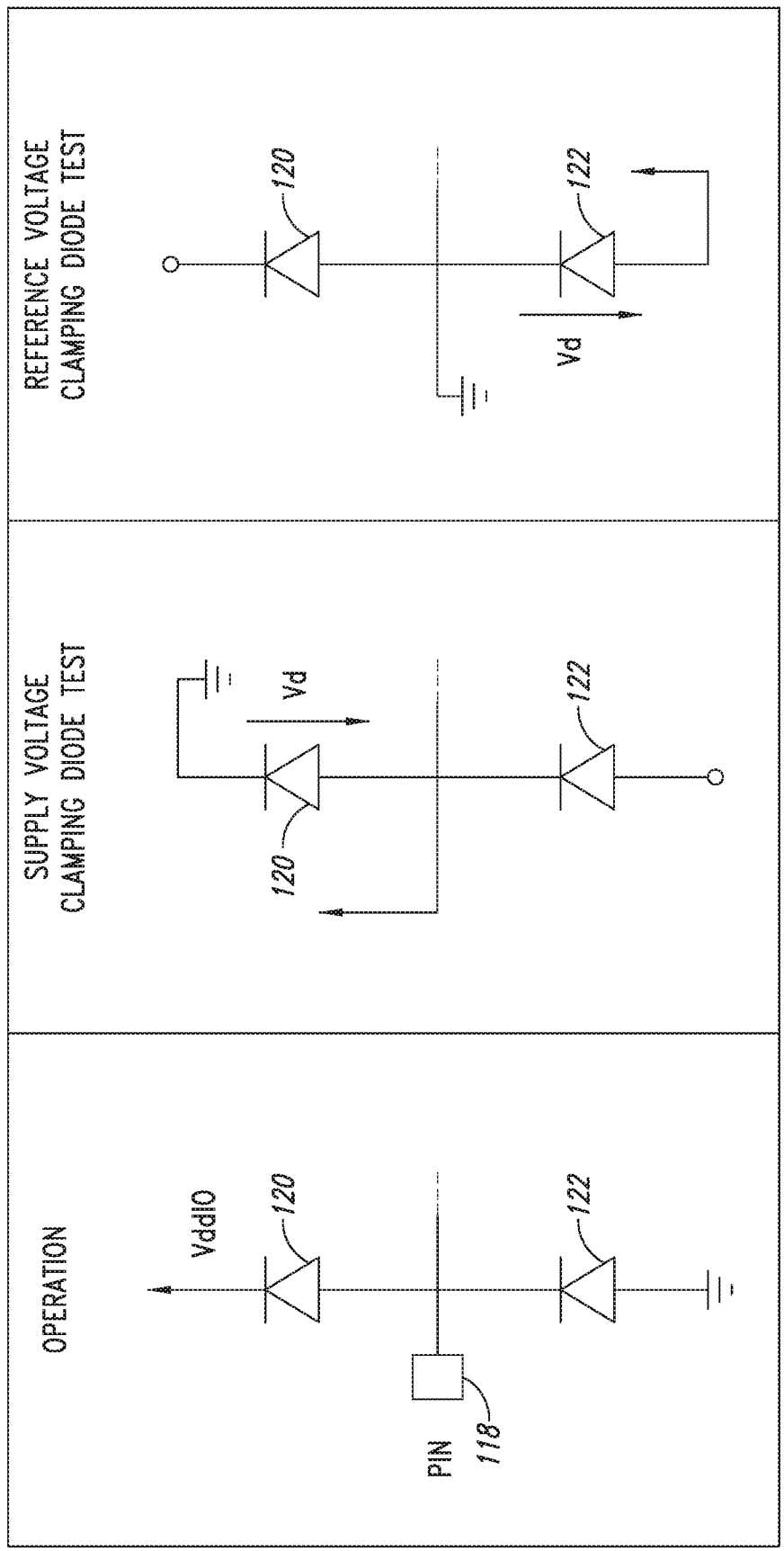
FIG. 4 shows clamping diode connectivity of a pin in accordance with an embodiment.

FIG. 4 shows clamping diode 120, 122 connectivity of a pin 118. The pin 118 is coupled to an anode of a supply voltage clamping diode 120 and a cathode of a reference voltage clamping diode 122. During testing of the MEMS sensor 102, a cathode of the supply voltage clamping diode 120 is coupled to an I/O supply voltage and an anode of the reference voltage clamping diode 122 is coupled to a reference voltage (for example, ground voltage).

For each pin 118, the continuity detection circuit 112 performs a supply voltage clamping diode test on the supply voltage clamping diode 120 and a reference voltage clamping diode test on the reference voltage clamping diode 122. When performing the supply voltage clamping diode test, the cathode of the supply voltage clamping diode 120 is coupled to a reference supply voltage node that supplies a reference voltage. The continuity detection circuit 112 measures the voltage drop across the supply voltage clamping diode 120 and determines, based on the voltage drop, whether the supply voltage clamping diode 120 is operating as intended.

Similarly, when performing the reference voltage clamping diode test, the anode of a reference voltage clamping diode 122 is coupled to an I/O supply voltage node that supplies an I/O supply voltage. The continuity detection circuit 112 measures the voltage drop across the reference voltage clamping diode 122 and determines, based on the voltage drop, whether the reference voltage clamping diode 122 is operating as intended.

When the voltage drop across the diode 120, 122 is between a defined voltage range having a first threshold, such as 0.3V, and a second threshold, such as 0.9V, the diode 120, 122 passes the test. The voltage range may be determined at manufacturing. The voltage range may be a range of voltages deemed to be normal operating conditions. When the voltage drop across the diode 120, 122 is within the voltage range, the diode 120, 122 is deemed to be operating properly.

When the voltage drop is below the first threshold, the diode 120, 122 is determined to be shorted. The short may be a result of an electrostatic discharge (ESD) event on the MEMS sensor 102. When the voltage drop is greater than the second threshold, the diode 120, 122 is determined to be open. A diode may be open if it is malfunctioning or if the corresponding pin of the MEMS sensor 102 is not electrically connected to the pad. The lack of electrical connectivity may be due to the presence of a residual flux or solder paste on the pad or the result of a break in the bonding between the pad and the pin.

Thus, the continuity detection circuit 112 tests the socket 116 and its associated diodes 120, 122 and the connection between a pin of the MEMS sensor 102 and a respective pad. The continuity detection circuit 112 tests the plurality of pins 118a-118d as described herein.

The current sensing circuit 110 measures the current consumption of the MEMS sensor 102. The current sensing circuit 110 measures the current consumption of 42 power domains of the MEMS sensor 102, the I/O power domain and the device power domain. The current sensing circuit 110 may measure the current consumption of the I/O power domain at the supply voltage pin 118a and may measure the current consumption of the device power domain at the supply voltage pin 118a. The current consumption of the device power domain may be measured while the MEMS sensor 102 is powered down and in various modes of operation of the MEMS sensor 102 in which the MEMS sensor 102 is turned on and in an operating state. For example, the current consumption of the device power domain may be measured while only the accelerometer of the MEMS sensor 102 is turned on, while only the gyroscope of the MEMS sensor 102 is turned on, or while both the accelerometer and gyroscope of the MEMS sensor 102 are turned on. The current consumption of the I/O power domain may be measured while the MEMS sensor 102 is turned on and in an operating state.

The current sensing circuit 110 may output data representative of the current consumption to the processor 104. The memory 114 may store ranges of current consumption values that are deemed typical or normal for the MEMS sensor 102. For each current consumption measurement, the processor 104 compares the measurement to the range of current consumption values and determines whether the current consumption measurement falls within the range. If the current consumption measurement falls within the range of current consumption values for the measurement, the processor 104 deems the current consumption measurement to be typical or normal. The processor 104 may generate a report indicating that the current consumption measurement is normal or passes. Conversely, if the current consumption measurement falls outside the range of current consumption values, the processor 104 deems the current consumption measurement to be atypical or abnormal. The processor 104 may indicate in the report that the current consumption measurement is abnormal or has failed the test.

The testing device 100 tests positional information output by the MEMS sensor 102. The testing device 100 may test the positional information for three axes (the x-axis, the y-axis and the z-axis). The testing device 100 may output a first instruction to the user to place the body 104 in a first position or orientation. The first instruction may be output to the computer 101. A user accessing the computer 101 (or viewing the computer screen) may receive (or view) the instruction and place the body 104 in the first orientation. The first orientation may be as shown in FIG. 1, where the body 104 rests on the first side 106a and gravity acts on the z-axis. The MEMS sensor 102 makes a plurality of first measurements over a period of time (such as, two seconds) at the first orientation and outputs the plurality of first measurements to the processor 104. The MEMS sensor 102 may be configured to make any number of measurements per second, such as 100 or 200 measurements per second. The measurements may be of the gravitational pull on three orthogonal axes of the MEMS sensor 102, such as the x-axis, y-axis and z-axis. Further, the measurements may be of the pitch, roll and yaw. The measurements may include measurements of cycle times, such as the amount time to cycle off and on, etc.

The testing device 100 receives the plurality of first measurements made by the testing device 100 at the first orientation. The processor 104 stores the plurality of first measurements. The processor 104 determines whether the first measurement of the plurality of first measurements satisfies a reliability criterion associated with the first orientation. The reliability criterion for the measurement may be one of a plurality of reliability criteria respectively corresponding to a plurality of measurements. The reliability criterion a first range of measurement values associated with the first orientation, among others.

The processor 104 compares a first measurement of the plurality of first measurements to a first range of measurement values associated with the first orientation. The first range of measurement values may be a range of expected measurement values for the MEMS sensor 102 at the first orientation. The processor 104 may deem the MEMS sensor 102 to operate normally or as expected if the first measurement is within the first range of measurement values and may deem the MEMS sensor 102 to operate abnormally or be malfunctioning if the first measurement is outside the first range of measurement values. Further, the processor 104 may compare a mean, a standard deviation or another function of the plurality of first measurements to a first range of measurement values for the mean, standard deviation or other function, respectively. Individual measurements, multiple measurements or the mean, standard deviation or another function of the plurality of measurements may form the basis for diagnosing the MEMS sensor 102.

In response to receiving the plurality of first measurements made at the first orientation, the testing device 100 may output a second instruction to the user. The second instruction may be output to the computer 101. The second instruction may indicate to the user that the testing device 100 is to be placed in the second orientation. In the second orientation, the body 104 may rest on a second side 106*b*, whereby gravity acts on the x-axis.

Similar to the first orientation, the MEMS sensor 102 outputs a plurality of second measurements made at the second orientation to the testing device 100. Similar to the first orientation, the testing device 100 stores the plurality of second measurements made at the second orientation in the memory 114 and evaluates one or more second measurements or a function of the second measurements to diagnose the MEMS sensor 102. In response to receiving the plurality of measurements made at the second position, the testing device 100 may output a third instruction to the user. The third instruction may be output to the computer 101. The third instruction may indicate to the user that the testing device 100 is to be placed in a third orientation. In the third orientation, the body 104 may rest on a third side 106*c* of the body 104, whereby gravity acts on the y-axis. The MEMS sensor 102 outputs a plurality of third measurements made at the third position to the testing device 100. The testing device 100 stores the plurality of measurements made at the third position in the memory 114.

In response to receiving the plurality of measurements made at the third position, the testing device 100 may output a fourth instruction to the user instructing the user to place the testing device 100 back in the first orientation, where gravity acts on the z-axis. The MEMS sensor 102 outputs a plurality of fourth measurements made at the first position to the testing device 100. The testing device 100 stores the plurality of fourth measurements made again at the first orientation in the memory 114. Placing the testing device 100 back in the first orientation may be a testing control mechanism. The testing device 100 may compare the plurality of fourth measurements and the plurality of first measurements to determine whether they correspond to each other. If the plurality of fourth measurements and the plurality of first measurements do not correspond to each other, the tests may be deemed to be not controlled. For Example, directionally opposite results may be expected for opposite sides, such as the first side 106*a* and the sixth side 106*f* or the second side 106*b* and the fourth side 106*d*.

In an embodiment, the testing device 100 may test a first input first output (FIFO) memory of the MEMS sensor 102. The FIFO memory may be a register, among others. The testing device 100 may test the FIFO memory to identify whether the FIFO memory has failed. The testing device 100 may compare two data sets acquired by the MEMS sensor 102. The first data set may be read directly from the MEMS sensor 102. The second data set may be read from the FIFO memory.

If the data in the FIFO memory corresponds to the data read directly from the MEMS sensor 102, the FIFO memory may be deemed to be operating correctly or normally and the FIFO memory "passes" the test. The FIFO memory may be automated and may be performed without user input.

FIG. 5 shows an example of a report 500 generated by the testing device 100. The report 500 may be output to the computer 101 for evaluation by the user. The report 500 may also be transmitted (for example, by the computer 101) to a manufacturer of the MEMS sensor 102, such as an OEM, for diagnosing potential malfunction of the MEMS sensor 102. The report 500 includes identification information 501 of the MEMS device 102. The identification information 501 includes an identity 502 of the MEMS device 102, a test date 504, a voltage 506 of the I/O power domain and the device power domain, an identity of a communication protocol 508 used to communicate with the MEMS sensor 102 over the one or more second communication devices 108 and a serial number 510 of the MEMS device 102.

The report 500 also includes a results section 511 that includes results of the tests performed on the MEMS sensor 102. The results section 511 includes a continuity test result 512, a current consumption test result 514, a positional measurement test result 516 and a FIFO memo test result 518.

The continuity test result 512 specifies whether the pins 118 of the socket 116 passed the continuity test described herein. The current consumption test result 514 indicates the measured current consumption in various scenarios. As shown in FIG. 5, the current consumption test result 514 specifies the current consumption 520 of the I/O power domain. Further, the current consumption test result 514 specifies the current consumption 522 of the device power domain in power down mode and the current consumption 524 of the device power domain in a combination operation mode in which the MEMS sensor 102 operates as an accelerometer and a gyroscope. The current consumption test result 514 specifies the current consumption 526 of the device power domain in an accelerometer operation mode in which the MEMS sensor 102 operates as an accelerometer. The current consumption test result 514 specifies the current consumption 528 of the device power domain in a gyroscope operation mode in which the MEMS sensor 102 operates as a gyroscope.

The report 500 may also indicate whether the current consumption values 520-528 are within a normal or acceptable operating range (for example, as specified in a data sheet of the MEMS sensor 102). For example, the current consumption values 520-528 may be color-coded to indicate whether the current consumption is within a normal or acceptable operating range based on a determination of whether the current consumption values 520-528 fall within respective ranges for the current consumption values 520-528.

The positional measurement test result 516 specifies, for each orientation of the body 104, the measured gravitational acceleration for each of the x-axis 530, the y-axis 532 and the z-axis 534. The mean and standard deviation of the measured gravitational acceleration (in milli-g (mg)) are shown in FIG. 5. For example, multiple measurements of the gravitational acceleration may be made at each orientation. The mean and standard deviation of the measurements of the gravitational acceleration may then be obtained.

The positional measurement test result 516 specifies, for each orientation of the body 104, measured angular velocity for each of the pitch 536, roll 538 and yaw axis 540. The mean and standard deviation of the measured angular velocity (in degrees per second (dps)) are shown in FIG. 5. For example, multiple measurements of the angular velocity may be made at each position. The mean and standard deviation of the measurements of the angular velocity may then be obtained. The positional measurement test result 516 may include test results for various modes of operation of the MEMS sensor 102, such as a normal mode (or high performance mode) and a self-test mode.

The MEMS sensor 102 may also have a self-test (ST) mode in which the MEMS sensor 102 determines and outputs measurements. The results of the self-test check, denoted as "ST check", may be output by the MEMS sensor 102 and included in the report 500.

The report 500 also includes a FIFO memo test result 518 indicating whether data in the FIFO memory corresponds to the data read directly from the MEMS sensor 102. The FIFO memo test result 518 indicates whether the FIFO memory operates normally.

In an embodiment, the report 500 may include an indicated of whether the MEMS sensor 102 as a whole "passed" or "failed." For example, the MEMS sensor 102 may be deemed to have failed testing if it has failed at least one of the performed tests. Conversely, if the MEMS sensor 102 passed all of the performed tests, the MEMS sensor 102 may be deemed to have "passed" overall testing. In an embodiment, the report 500 may include, for each different type of measurement, a range of measurement results that are deemed to be normal. If a measurement falls outside its respective range, then the MEMS sensor 102 may be deemed to have failed the measurement.

In an embodiment, the computer 101 or memory 114 of the testing device 100 may store one or more test programs associated with different types of MEMS sensors. Further, the MEMS sensor 102 may store a test program associated with the MEMS sensor 102. Each test program may be configured for testing a different type of MEMS sensor 102. When executed, the test programs may be loaded to the processor 104 for execution and testing the associated MEMS sensor 102. Thus, the testing device 100 may be capable of testing different types of MEMS devices 102. A test program may be code or executable instructions that, when executed by the processor 104, cause the processor 104 or testing device to perform the testing techniques described herein.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), state machines, digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a socket configured to be coupled to a microelectromechanical system (MEMS) sensor;
a body having a plurality of operable positions associated with a respective plurality of orientations of the MEMS sensor; and
circuitry which, in operation, performs a method for testing the MEMS sensor in the plurality of operable positions, the method including:
for each position of the plurality of operable positions:
outputting an indication of the position to the plurality of operable positions;
receiving one or more measurements made by the MEMS sensor at the respective position of the plurality of operable positions; and
determining whether the one or more measurements satisfy a reliability criterion of a plurality of reliability criteria;
generating a report based on the one or more measurements and indicating whether the one or more measurements satisfy the plurality of reliability criteria, respectively; and
outputting the report,
wherein the circuitry includes a current sensing circuit coupled to the socket and configured to measure current consumption of one or more power domains of the MEMS sensor and output the measured current consumption of one or more power domains.

2. The device of claim 1, wherein the circuitry in operation:
receives the measured current consumption of one or more power domains;
determines whether the measured current consumption falls within a range of current consumption values; and
generates the report indicating the measured current consumption and whether the measured current consumption falls within the range of current consumption values.

3. The device of claim 1, wherein the MEMS sensor includes a plurality of pins and the socket includes a plurality of pads, and wherein the circuitry, in operation, performs continuity testing on the plurality of pins.

4. The device of claim 3, wherein the plurality of pins are configured to be coupled to plurality of pads, respectively, and wherein each pin of the plurality of pins is coupled to an anode of a supply voltage clamping diode and a cathode of a reference voltage clamping diode.

5. The device of claim 4, wherein the circuitry includes a continuity detection circuit which in operation:
   couples a cathode of the supply voltage clamping diode to a reference supply voltage node that supplies a reference voltage;
   detects a voltage drop across the supply voltage clamping diode;
   couples an anode of the reference voltage clamping diode to a supply voltage node that supplies a supply voltage;
   detects a voltage drop across the reference voltage clamping diode; and
   outputs an indication of the voltage drop across the supply voltage clamping diode and the voltage drop across the reference voltage clamping diode to the circuitry.

6. The device of claim 5, wherein the circuitry in operation:
   receives the indication of the voltage drop across the supply voltage clamping diode and the voltage drop across the reference voltage clamping diode;
   determines whether the voltage drop across the supply voltage clamping diode is within a range of voltages;
   determines whether the voltage drop across the reference voltage clamping diode is within the range of voltages;
   determines that the supply voltage clamping diode is malfunctioning if the voltage drop across the supply voltage clamping diode is outside the range of voltages;
   determines that the reference voltage clamping diode is malfunctioning if the voltage drop across the reference voltage clamping diode is outside the range of voltages; and
   generates the report indicating whether the supply voltage clamping diode is malfunctioning and whether the reference voltage clamping diode is malfunctioning.

7. The device of claim 1, wherein the circuitry in operation:
   generates the report including an identity of the MEMS sensor, a test date, a voltage of the one or more power domains of the MEMS sensor and an identity of a communication protocol used to communicate with the MEMS sensor.

8. The device of claim 1, wherein the circuitry in operation:
   retrieves data stored in a first input first output (FIFO) memory of the MEMS sensor;
   determines whether the data retrieved from the FIFO memory and data retrieved from the MEMS sensor correspond to each other; and
   in response to determining that the data retrieved from the FIFO memory and corresponds to the data retrieved from the MEMS sensor, generates the report indicating that the FIFO memory is operating properly.

9. The device of claim 1, wherein the body is a cube and the plurality of operable positions are associated with a plurality of sides of the cube.

10. The device of claim 1, wherein determining whether the one or more measurements satisfy the reliability criterion includes determining whether the one or more measurements are within a respective range of values associated with the position of a plurality of ranges of values.

11. A method, comprising:
   outputting, by a processor of a portable hand-held testing device, an indication of a position of a plurality of operable positions of the portable hand-held testing device, the position of the plurality of operable positions being associated with a respective orientation of a plurality of orientations of a microelectromechanical system (MEMS) sensor;
   receiving, by the processor, one or more measurements made by the MEMS sensor at the position;
   determining, by the processor, whether the one or more measurements are within a range of values associated with the position;
   measuring, by a current sensing circuit of the portable hand-held testing device, current consumption of one or more power domains of the MEMS sensor;
   determining, by the processor, whether the measured current consumption is within a range of current consumption values;
   generating a report indicating the one or more measurements, whether the one or more measurements are within the range of values, the measured current consumption and whether the measured current consumption is within the range of current consumption values; and
   outputting the report.

12. The method of claim 11, wherein the MEMS sensor includes a plurality of pins and wherein each pin of the plurality of pins is coupled to an anode of a supply voltage clamping diode and a cathode of a reference voltage clamping diode.

13. The method of claim 12, comprising:
   coupling, by a continuity detection circuit of the portable hand-held testing device, a cathode of the supply voltage clamping diode to a reference supply voltage node that supplies a reference voltage;
   detecting a voltage drop across the supply voltage clamping diode;
   coupling an anode of the reference voltage clamping diode to a supply voltage node that supplies a supply voltage; and
   detecting a voltage drop across the reference voltage clamping diode.

14. The method of claim 13, comprising:
   determining, by the processor, whether the voltage drop across the supply voltage clamping diode is within a range of voltages;
   determining, by the processor, whether the voltage drop across the reference voltage clamping diode is within the range of voltages;
   determining, by the processor, that the supply voltage clamping diode is malfunctioning if the voltage drop across the supply voltage clamping diode is outside the range of voltages;
   determining, by the processor, that the reference voltage clamping diode is malfunctioning if the voltage drop across the reference voltage clamping diode is outside the range of voltages; and
   generating, by the processor, the report indicating whether the supply voltage clamping diode is malfunctioning and whether the reference voltage clamping diode is malfunctioning.

15. The method of claim 11, comprising:
   generating the report including an identity of the MEMS sensor, a test date and an identity of a communication protocol used to communicate with the MEMS sensor.

16. The method of claim 11, wherein the portable hand-held testing device has a cubic body and the plurality of operable positions are associated with a plurality of sides of the cubic body.

17. The method of claim 11, comprising:
outputting, by the processor of the portable hand-held testing device, an indication of a second position of the plurality of operable positions of the portable hand-held testing device;
receiving, by the processor, one or more second measurements made by the MEMS sensor at the second position;
determining, by the processor, whether the one or more second measurements are within a second range of values associated with the second position; and
generating the report indicating the one or more second measurements and whether the one or more second measurements are within the second range of values.

18. A non-transitory computer readable medium; having stored thereon instructions that, when executed by a computing device, cause the computing device to perform operations comprising:
outputting an indication of a position of a plurality of operable positions of a portable hand-held testing device, the position of the plurality of operable positions being associated with a respective orientation of a plurality of orientations of a microelectromechanical system (MEMS) sensor;
receiving one or more measurements made by the MEMS sensor at the position;
determining whether the one or more measurements are within a range of values associated with the position;
measuring current consumption of one or more power domains of the MEMS sensor;
determining whether the measured current consumption is within a range of current consumption values;
generating a report indicating the one or more measurements, whether the one or more measurements are within the range of values, the measured current consumption and whether the measured current consumption is within the range of current consumption values; and
outputting the report.

19. The non-transitory computer readable medium of claim 18, wherein the instructions cause the computing device to perform operations comprising:
generating the report including an identity of the MEMS sensor, a test date and an identity of a communication protocol used to communicate with the MEMS sensor.

20. The non-transitory computer readable medium of claim 18, wherein the instructions cause the computing device to perform operations comprising:
outputting an indication of a second position of the plurality of operable positions of the portable hand-held testing device;
receiving one or more second measurements made by the MEMS sensor at the second position;
determining whether the one or more second measurements are within a second range of values associated with the second position; and
generating the report indicating the one or more second measurements and whether the one or more second measurements are within the second range of values.

21. A device, comprising:
a socket configured to be coupled to a microelectromechanical system (MEMS) sensor;
a body having a plurality of operable positions associated with a respective plurality of orientations of the MEMS sensor; and
circuitry which, in operation, performs a method for testing the MEMS sensor in the plurality of operable positions, the method including:
for each position of the plurality of operable positions:
outputting an indication of the position to the plurality of operable positions;
receiving one or more measurements made by the MEMS sensor at the respective position of the plurality of operable positions; and
determining whether the one or more measurements satisfy a reliability criterion of a plurality of reliability criteria;
generating a report based on the one or more measurements and indicating whether the one or more measurements satisfy the plurality of reliability criteria, respectively; and
outputting the report,
wherein the circuitry in operation:
retrieves data stored in a first input first output (FIFO) memory of the MEMS sensor;
determines whether the data retrieved from the FIFO memory and data retrieved from the MEMS sensor correspond to each other; and
in response to determining that the data retrieved from the FIFO memory and corresponds to the data retrieved from the MEMS sensor, generates the report indicating that the FIFO memory is operating properly.

22. The device of claim 21, wherein the body is a cube and the plurality of operable positions are associated with a plurality of sides of the cube.

23. The device of claim 21, wherein determining whether the one or more measurements satisfy the reliability criterion includes determining whether the one or more measurements are within a respective range of values associated with the position of a plurality of ranges of values.

* * * * *